United States Patent
Kim et al.

(10) Patent No.: US 7,082,680 B2
(45) Date of Patent: Aug. 1, 2006

(54) MOUNTING METHOD OF ELECTRONIC COMPONENTS

(75) Inventors: Hyo Won Kim, Kyungki-do (KR); Byung Joon Lee, Kyungki-do (KR)

(73) Assignee: Mirae Corporation, Chunan-si (KR)

( * ) Notice: Subject to any disclaimer, the term of this patent is extended or adjusted under 35 U.S.C. 154(b) by 366 days.

(21) Appl. No.: 10/295,834

(22) Filed: Nov. 18, 2002

(65) Prior Publication Data

US 2004/0211059 A1    Oct. 28, 2004

(30) Foreign Application Priority Data

Nov. 21, 2001  (KR) ...................... 10-2001-0072800
Nov. 21, 2001  (KR) ...................... 10-2001-0072801

(51) Int. Cl.
*H05K 3/30* (2006.01)

(52) U.S. Cl. ............................. 29/832; 29/739; 29/740
(58) Field of Classification Search .................. 29/739, 29/740, 741, 832, 833
See application file for complete search history.

(56) References Cited

U.S. PATENT DOCUMENTS

| 4,631,812 | A | * | 12/1986 | Young .......................... 29/714 |
| 5,778,524 | A | * | 7/1998 | Stridsberg ..................... 29/836 |
| 6,189,674 | B1 | | 2/2001 | Izumida et al. ......... 198/341.01 |
| 6,550,135 | B1 | * | 4/2003 | Nakahara et al. ............. 29/833 |

* cited by examiner

*Primary Examiner*—Richard Chang
(74) *Attorney, Agent, or Firm*—Fleshner & Kim LLP

(57) ABSTRACT

Mounting methods of electronic components in which the electronic components are mounted on plural printed circuit boards are disclosed. An exemplary method includes: supplying a printed circuit board on a first conveyor; transferring the printed circuit board to the third conveyor and simultaneously, transferring the printed circuit board transferred to the first conveyor to the second conveyor; mounting the electronic components to about half-portion of the printed circuit board by moving the printed circuit board to one side and simultaneously, mounting the electronic components to about half-portion from the original position of the printed circuit board; and transferring the printed circuit board to a fourth conveyor, simultaneously transferring the printed circuit board to the second conveyor to the third conveyor and then discharging the printed circuit boards sequentially.

3 Claims, 9 Drawing Sheets

MOUNTING METHOD OF ELECTRONIC COMPONENTS

BACKGROUND OF THE INVENTION

1. Field of the Invention

The present invention relates to a mounting method of electronic components, more particularly, to a mounting method of electronic components in which the electronic components are mounted on plural printed circuit boards and so the mounting time of the electronic components is reduced.

2. Description of the Background Art

The mounting method of the electronic components is performed by a surface mounting device, and the mounting method of the electronic components comprises the steps of: supplying a printed circuit board (hereinafter, referred to a "board"); transferring the supplied board; mounting the electronic components on the board; and discharging the board mounted the electronic components.

FIG. 1 is a conceptual view illustrating a mounting method of electronic components according to a conventional art. As shown in FIG. 1, the mounting apparatus of electronic components according to the conventional art comprises: a base frame 1, X and Y gantries 2 and 3 mounted to an upper portion of the base frame; mounting heads 4 and 5 mounted movably along a straight line to a side of the base frame; electronic component feeding devices 6 and 7 for feeding the electronic components mounted to both sides of the base frame 1, so that the mounting heads 4 and 5 can pick up the electronic components; a first conveyor C2, a conveyor C2 and a second conveyor C3 for enabling the board P to move, so that the mounting heads picked up the electronic components can mount the electronic components.

The board P supplied from the first conveyor C1 is transferred to the mounting heads 4 and 5 by a conveyor C2. The mounting heads 4 and 5 move toward X and Y shafts by the X and Y gantries 2 and 3, suck the electronic components and mount the electronic component to the board of the upper working area A of the conveyor C2. In the mounting heads 4 and 5 positioned at both sides of the conveyor C2, respectively, a one mounting head, a first mounting head 4 mounts the electronic components to a nearly half-portion of the board P corresponding to the mounting head 4 and the other head, a second mounting head 5 mounts the electronic components to a remnant portion of the board P, not mounted the electronic components, corresponding to the mounting head 5.

At this time, when operations by the first and second mounting heads 4 and 5 are performed simultaneously, since an interruption between the mounting heads 4 and 5 may be occurred, the first and second mounting heads 4 and 5 perform the mounting work sequentially, not simultaneously. When completing the mounting work, the board P is transferred to the second conveyor C3 by the conveyor C2. The second conveyor C3 transfers the board P completed the mounting work to a discharge buffer (not shown).

Accordingly, according to the mounting method of the electronic components of the conventional art, there are several disadvantages as follows.

Since the electronic component can be mounted to only one printed circuit board P and two mounting heads 4 and 5 cannot perform the mounting work simultaneously, the mounting of the electronic component is in need of much time and so the productivity is deteriorated.

Further, although the printed circuit boards P have various sizes, since the conveyors C1–C3 for transferring the printed circuit boards P have a constant width, the electronic component cannot be mounted to the printed circuit boards having larger or smaller sizes than the sizes of the conveyors C1–C3, so that the mounting apparatuses corresponding to the sizes of the printed circuit boards are needed.

SUMMARY OF THE INVENTION

Accordingly, it is a primary object of the present invention to provide a mounting method of electronic components in which electronic components can be mounted to a plurality of printed circuit boards without interrupting mounting heads in a short time.

Another object of the present invention is to provide a mounting method of electronic components in which the electronic components can be mounted to the printed circuit boards having different sizes.

In one aspect of the present invention, to achieve the above-described objects of the invention, there is provided a mounting method for electronic components comprising: a step for controlling widths of plural conveyors; a step for supplying a printed circuit board on a first conveyor; a step for transferring the printed circuit board to the second conveyor and simultaneously, supplying a new printed circuit board to the first conveyor; a step for transferring the printed circuit board to the third conveyor and simultaneously, transferring the printed circuit board transferred to the first conveyor to the second conveyor; a step for mounting the electronic components to about half-portion of the printed circuit board reached in good condition to the third conveyor by moving the printed circuit board to one side and simultaneously, mounting the electronic components to about half-portion from the original position of the printed circuit board reached in good condition to the second conveyor; a step for mounting the electronic components to the remnant portion of the printed circuit board reached in good condition to the third conveyor by moving the printed circuit board to the original position and simultaneously, mounting the electronic components to the remnant portion of the printed circuit board reached in good condition to the second conveyor by moving the printed circuit board to one side; and a step for transferring the printed circuit board reached in good condition to the third conveyor to a fourth conveyor, simultaneously transferring the printed circuit board reached in good condition to the second conveyor to the third conveyor and then discharging the printed circuit boards sequentially.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A mounting method of electronic components in accordance with preferred embodiments of the present invention will now be described in detail with reference to the accompanying drawings.

Figure 1:
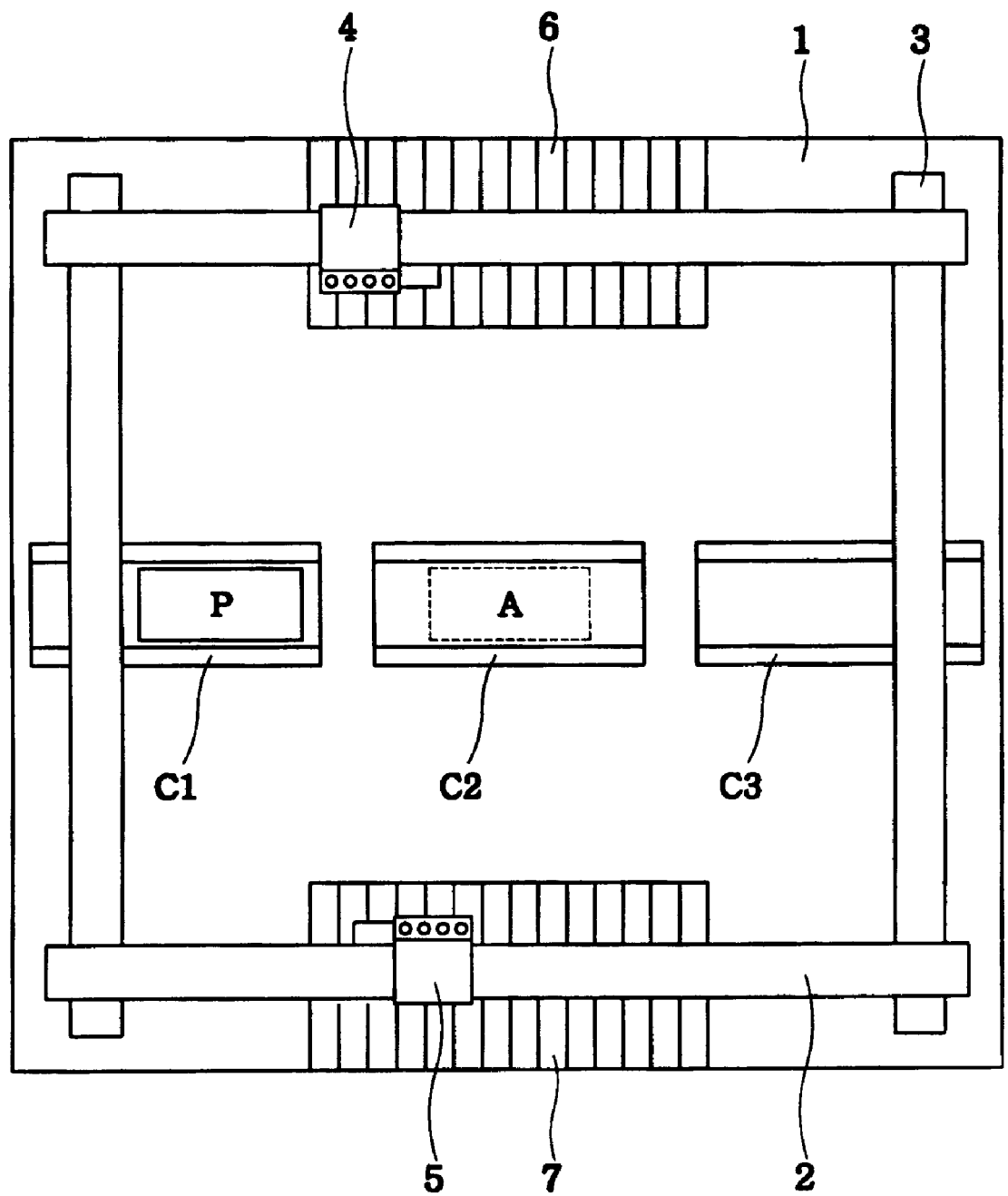
FIG. 1 is an outline view illustrating a mounting method of electronic components according to a conventional art.
Figure 2:
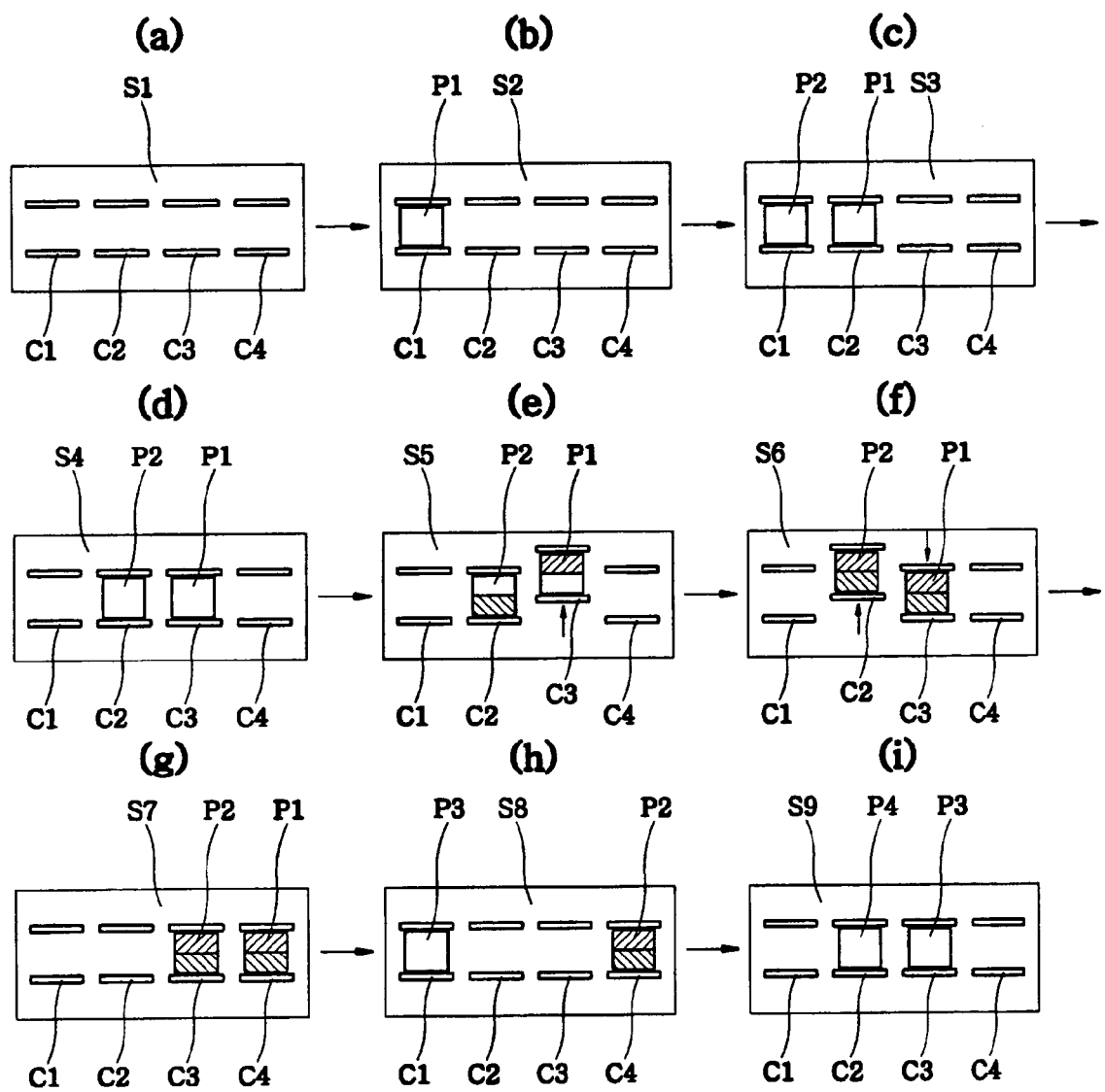
FIGS. 2 to 9 are flow charts illustrating a mounting process of electronic components according to the mounting method of the electronic components of the present invention.

As shown in FIGS. 2a to 2i, a mounting method of electronic components according to a first embodiment of the present invention comprises:

a. a step S1 for controlling widths of the first to fourth conveyors C1–C4 matching to the width of the printed circuit board P;

b. a step S2 for transferring the printed circuit board P1 loaded to a charge buffer to the first conveyor C1 by using a transfer means (not shown) after controlling the widths of the first to fourth conveyors C1 to C4;

c. a step S3 for transferring the printed circuit board P1 transferred to the first conveyor C1 to the second conveyor C2 and simultaneously, transferring a new printed circuit board P2 loaded to the charge buffer to the first conveyor C1; and d. a step S4 for transferring the printed circuit boards P1 and P2 transferred to the second conveyor C2 and the first conveyor C1 to the third conveyor C3 and the second conveyor C2 as the next step.

The above steps of a to d are preparing steps for mounting the electronic components and the steps for mounting the electronic components will be described as follows, that is, a mounting method for electronic components further comprises:

e. a step S5 for moving two mounting heads in an original state of the second conveyor C2 after transferring the third conveyor C3 to a mounting head positioned at an upper side (or a lower side) and mounting the electronic components to only about half-portion of the printed circuit boards P1 and P2 loaded to the conveyors C2 and C3;

f. a step S6 for returning the third conveyor C3 when completing the mounting work, transferring the second conveyor C2 to an upper side (or a lower side), and thereafter mounting the electronic components to a remnant portion of the printed circuit boards P1 and P2, not mounted the electronic components, by the mounting heads.

The above steps of e to f are steps for mounting the electronic components to the printed circuit board P.

Following steps of g to I are steps for discharging the printed circuit board P, that is, a mounting method of electronic components further comprises:

g. a step S7 for transferring the printed circuit board P1 loaded to the third conveyor C3 to the fourth conveyor C4 after returning the second conveyor C2 to the original position and simultaneously transferring the printed circuit board P2 loaded to the second conveyor C2 to the third conveyor C3;

h. a step S8 for transferring the printed circuit board P1 transferred to the fourth conveyor C4 to a discharge buffer, simultaneously transferring the printed circuit board P2 transferred to the third conveyor C3 to the fourth conveyor C4 and then discharging the printed circuit board P2 to the discharge buffer; and i. a step S9, in which a new printed circuit board P3 is loaded in the first conveyor C1 as a wait state when mounting the electronic components and when the printed circuit board P2 loaded the electronic components in the second conveyor C2 is discharged to the discharge buffer, the new printed circuit board P3 of the wait state loaded to the first conveyor C1 is transferred to the third conveyor C3 through the second conveyor C2 and thereafter the next printed circuit board P4 is transferred to the second conveyor C2.

When the printed circuit boards P3 and P4, not mounted the electronic components, are loaded to the second and third conveyors C2 and C3, the electronic components are mounted through the steps of e to f and then the printed circuit boards mounted the electronic components are discharged through the steps of h to i.

By performing the above steps repeatedly, electronic components are mounted to plural printed circuit boards successively. The first conveyor C1 is a charge conveyor and the fourth conveyor C4 is a discharge conveyor.

Figure 3:
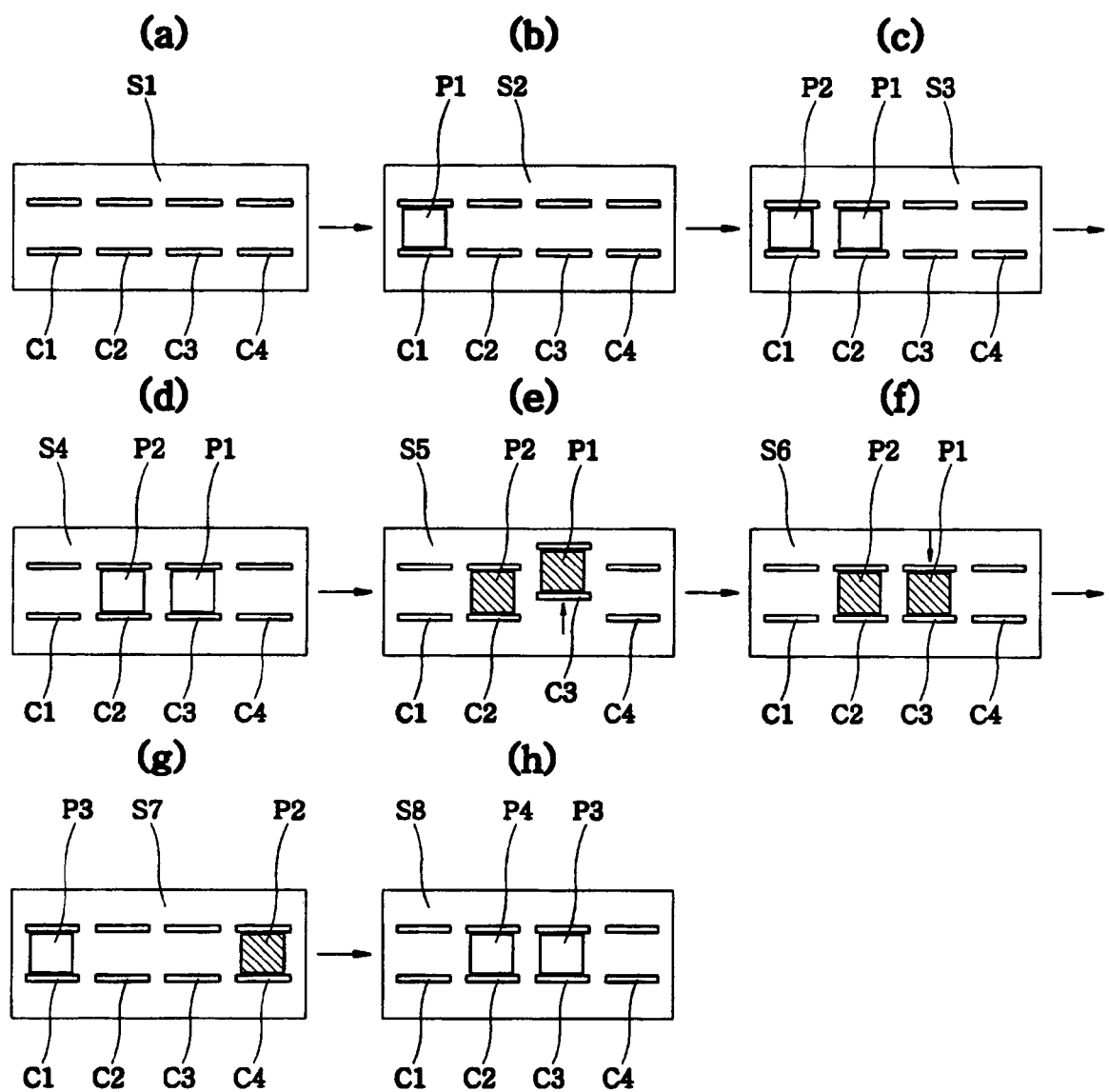

As shown in FIGS. 3a to 3f, a mounting method of electronic components according to a second embodiment of the present invention comprises:

a. a step S1 for controlling widths of the first to fourth conveyors C1–C4 matching to the width of the printed circuit board P;

b. a step S2 for transferring the printed circuit board P1 to the first conveyor C1;

c. a step S3 for transferring the printed circuit board P1 transferred to the first conveyor C1 to the second conveyor C2 and simultaneously, transferring a new printed circuit board P2 loaded to a buffer to the first conveyor C1;

d. a step S4 for transferring the printed circuit boards P1 and P2 transferred to the second conveyor C2 and the first conveyor C1 to the third conveyor C3 and the second conveyor C2 as the next step.

e. a step S5 for mounting the electronic components to the entire portion of the printed circuit board P1 reached in good condition to the third conveyor C3 by transferring the third conveyor C3 to a mounting head of one side and simultaneously, mounting the electronic components to the entire portion of the printed circuit board P2 reached in good condition to the second conveyor C2 by a mounting head of the other side in a state that the second conveyor C2 does not moved;

f. a step S6 for returning the third conveyor C3 when completing the mounting work;

g. a step S7 for transferring the printed circuit board P1 reached in good condition to the third conveyor C3 to the fourth conveyor C4, simultaneously transferring the printed circuit board P2 reached in good condition to the second conveyor C2 to the third and fourth conveyors C3 and C4 and discharging the printed circuit boards sequentially; and h. a step S8 for waiting a new printed circuit board P3 to the first conveyor C1 of the charge buffer side until the printed circuit boards P1 and P2 mounted the electronic components and reached in good condition to the second and third conveyors C2 and C3 and then when discharging the printed circuit boards, loading printed circuit boards P3 and P4 to the second conveyor C2 to the third conveyor C3.

By performing the above steps repeatedly, electronic components are mounted to plural printed circuit boards successively. In comparison with the first embodiment, although the mounting work for mounting the electronic components simultaneously to the printed circuit boards P2 and P1 reached in good condition to the second and third conveyors C2 and C3 is similar to that of the first embodiment, the second embodiment is characterized in that the second conveyor C2 mounts the electronic components at its original position, does not move toward the mounting head side.

Figure 4:
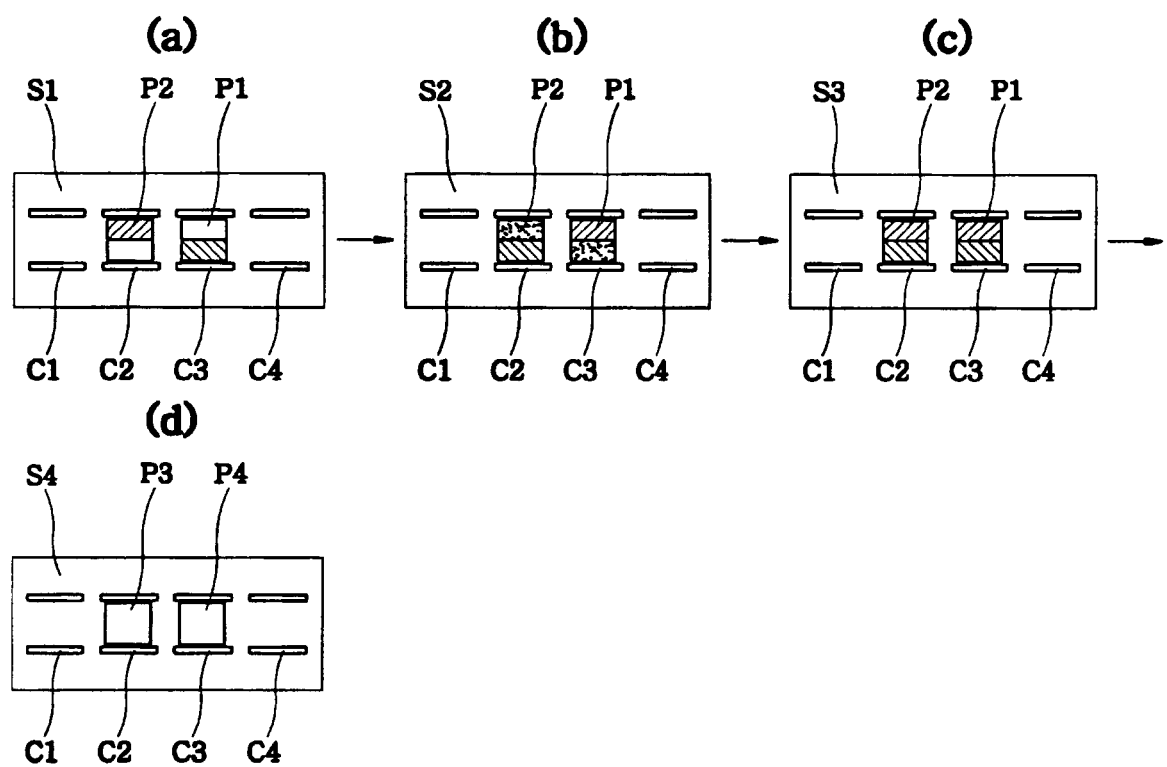

FIGS. 4a to 4d are views illustrating mounting steps of electronic components according to a third embodiment of the present invention. As shown in FIGS. 4a to 4d, a mounting method of electronic components according to a third embodiment of the present invention will be described hereinafter.

Since the step for transferring the printed circuit board to the second and third conveyors is the same as those of the first and second embodiments, hereinafter, only different points (new steps) are described. A mounting method of electronic components comprises:

a. a step in which when the printed circuit boards P2 and P1 are reached in good condition to the second and third conveyors C2 and C3, electronic components are mounted to only about half-portion of the second and third conveyors C2 and C3 by mounting heads mounted at opposite sides against each other corresponding to the second and third conveyors C2 and C3;

b. a step S2 in which when completing the mounting work to the half-portion, the second and third conveyors C2 and C3 are rotated with 180° by each rotating means and the portions, not mounted electronic components, are corresponded to the mounting heads;

c. a step S3 for mounting the electronic components to the remnant portions of the printed circuit boards P1 and P2 reached in good condition to the second and third conveyors C2 and C3; and d. a step S4 in which the printed circuit boards P1 and P2 completed the mounting are discharged passing through the steps of the first and second embodiments sequentially and simultaneously the printed circuit boards P3 and P4 of the waiting state are transferred to the second and third conveyors C2 and C3, so that the mounting of the printed circuit boards P3 and P4 is prepared.

In comparison with the first and second embodiments, although the mounting work for mounting the electronic components by loading the printed circuit boards to the second and third conveyors C2 and C3 is similar to those of the first and second embodiments, the third embodiment is characterized in that the electronic components are mounted without moving the second and third conveyors.

Figure 5:
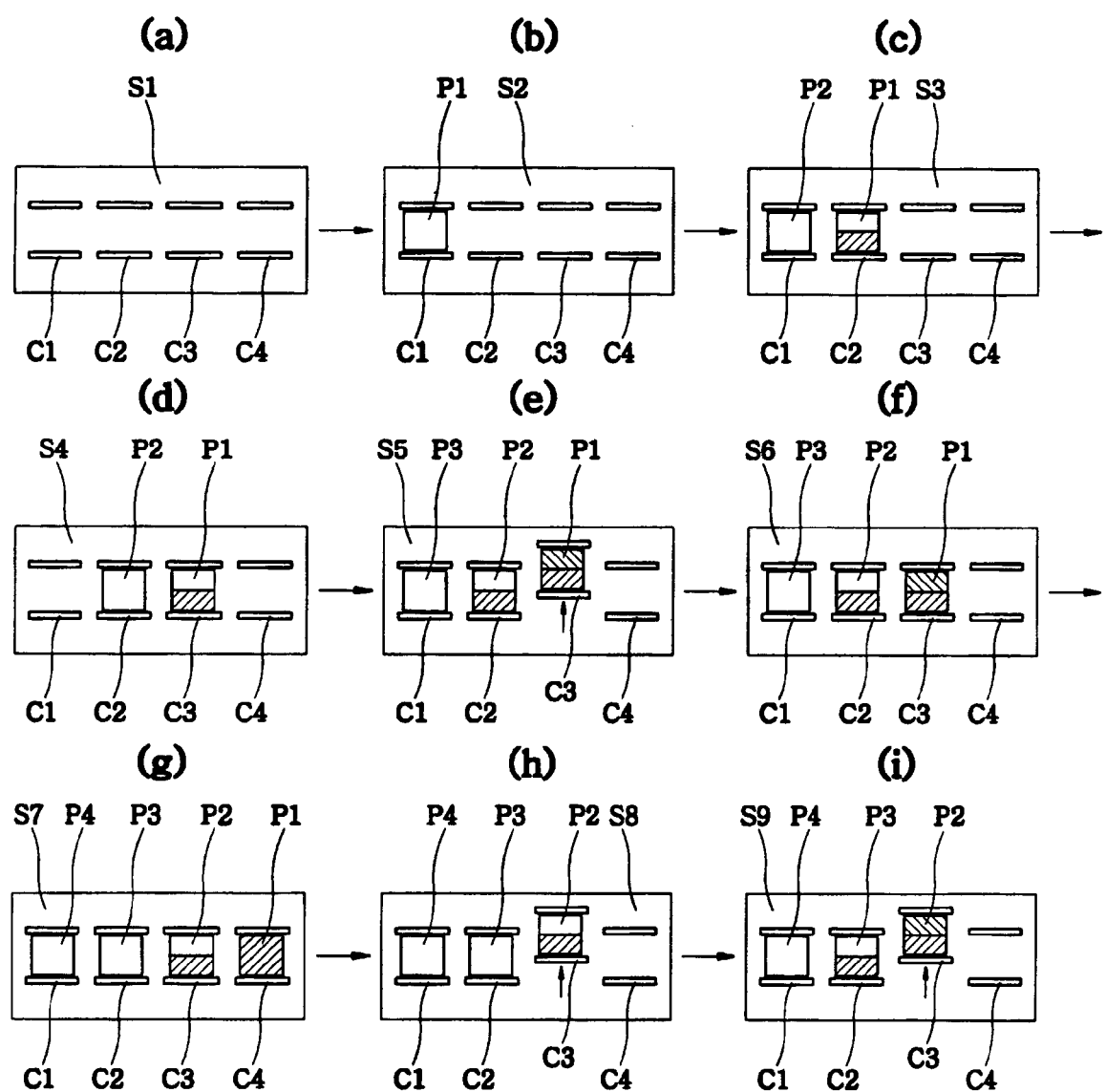

FIGS. 5a to 5i are views illustrating mounting steps of electronic components according to a fourth embodiment of the present invention. As shown in FIGS. 5a to 5d, a mounting method of electronic components according to the fourth embodiment of the present invention comprises:

a. a step S1 for controlling widths of the first to fourth conveyors C1–C4 matching to the width of the printed circuit board P1 loaded to a buffer side;

b. a step S2 for transferring the printed circuit board P1 to the first conveyor C1;

c. a step S3 for transferring the printed circuit board P1 transferred to the first conveyor C1 to the second conveyor C2, simultaneously, a new printed circuit board P2 loaded to the buffer to the first conveyor C1, and mounting the electronic components to the printed circuit board P1 reached in good condition to the second conveyor C2; and d. a step S4 for transferring the third conveyor C3 to one side after transferring the printed circuit board P1 mounted the electronic components in the second conveyor C2 to the third conveyor C3, simultaneously, transferring the printed circuit board P2 reached in good condition to the first conveyor C1 to the second conveyor C2, and waiting a new printed circuit board P3 to the first conveyor C1;

e. a step S5 for transferring the third conveyor C3 to a mounting head of the other side, mounting electronic components to the remnant portion of the printed circuit board P1 reached in good condition to the third conveyor C3 by the mounting head of the other side, and simultaneously, mounting electronic components to about half-portion of the printed circuit board P2 transferred to the second conveyor C2 by the mounting head 5 of one side;

f. a step S6 for returning the second conveyor C3 to the original position;

g. a step S7 for transferring the printed circuit board P1 mounted the electronic components in the third conveyor C3 to the fourth conveyor C4, simultaneously transferring the printed circuit board P2 reached in good condition to the second conveyor C2 to the third conveyor C3, transferring the printed circuit board P3 provided to the first conveyor C1 to the second conveyor C2, and waiting a new printed circuit board P4 to the first conveyor C1;

h. a step S8 for transferring the third conveyor C3 to the mounting head of one side; and i. a step S9 for mounting electronic components to about half-portion of the printed circuit board P3 transferred to the second conveyor C2 by the mounting head of one side, and simultaneously, mounting electronic components to the printed circuit board P2 reached in good position to the third conveyor C3 by the mounting head 2 of the other side.

Figure 6:
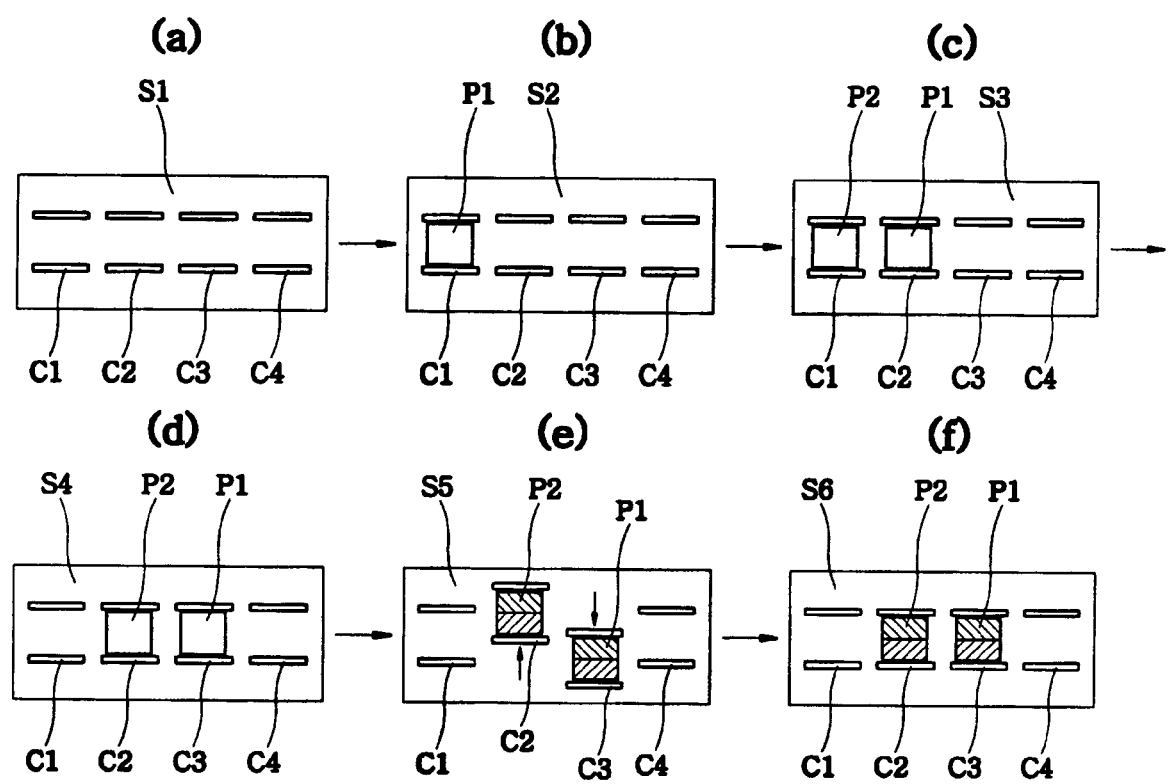

FIGS. 6a to 6f are views illustrating mounting steps of electronic components according to a fifth embodiment of the present invention. As shown in FIGS. 6a to 6f, a mounting method of electronic components according to the fifth embodiment of the present invention comprises:

a. a step S1 for controlling widths of the first to fourth conveyors C1–C4 matching to the width of the printed circuit board P1 loaded to a buffer side;

b. a step S2 for supplying the printed circuit board P1 to the first conveyor C1;

c. a step S3 for transferring the printed circuit board P1 to the second conveyor C2 and simultaneously, supplying a new printed circuit board P2 to the first conveyor C1;

d. a step S4 for transferring the printed circuit board P1 reached in good condition on the second conveyor C2 to the third conveyor C3 and simultaneously, transferring a new printed circuit board P2 reached in good condition on the first conveyor C1 to the second conveyor C2;

e. a step S5 for moving the first and second conveyors C2 and C3 having loaded printed circuit boards P2 and P1, respectively, toward a direction corresponding to each other and then performing the mounting work of electronic components by mounting heads 4 and 5; and f. a step S6 for moving the first and second conveyors C2 and C3 to their original positions after completing the mounting work of electronic components and then discharging the electronic components sequentially.

Figure 7:
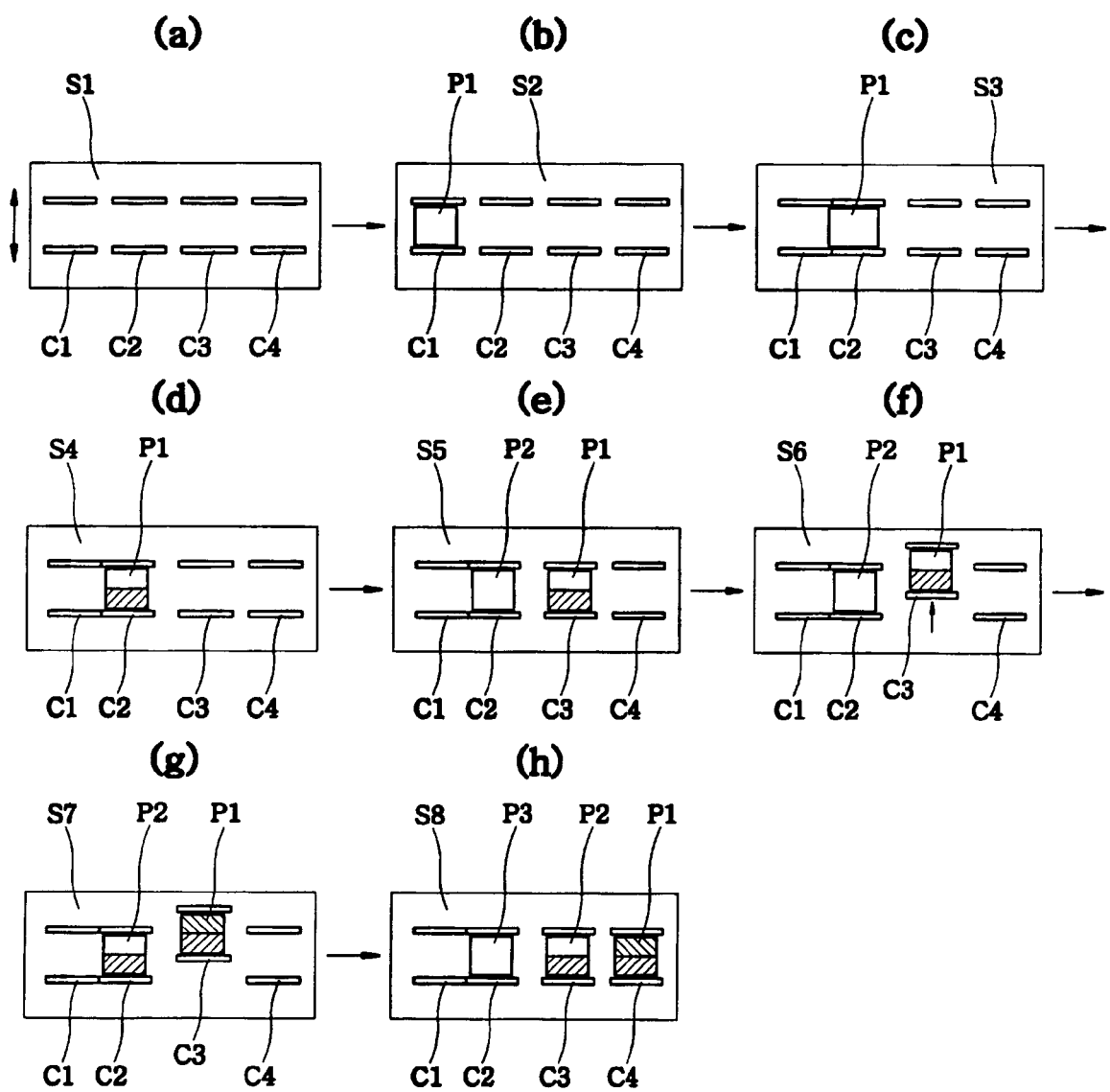

FIGS. 7a to 7h are views illustrating mounting steps of electronic components according to a sixth embodiment of the present invention. As shown in FIGS. 7a to 7h, a mounting method of electronic components according to the sixth embodiment of the present invention comprises:

a. a step S1 for controlling widths of the first to fourth conveyors C1–C4 matching to the width of the printed circuit board P1 loaded to a buffer side;

b. a step S2 for waiting the printed circuit board P1 to the first conveyor C1;

c. a step S3 for connecting the first and second conveyors C1 and C2 in order to be corresponded to the length of the printed circuit board P1 and synchronizing the first and second conveyors C1 and C2, wherein in the step S3, concave and convex units, not shown, are formed at facing portions of the first and second conveyors C1 and C2 and then the first and second conveyors C1 and C2 are combined mutually by the concave and convex units.

d. a step S4 for transferring the printed circuit board P1 to the second conveyor C2 and then mounting electronic components to about half-portion of the printed circuit board P1;

e. a step S5 for transferring the printed circuit board P1 reached in good condition to the integrated first and second conveyors C1 and C2 to the third conveyor C3 and simultaneously, supplying a new printed circuit board P2 to the first and second conveyor C1 and C2;

f. a step S6 for transferring the third conveyor C3 to one side;

g. a step S7 for mounting the electronic components to the remnant portion of the printed circuit board P1 reached in good condition to the third conveyor C3 and simultaneously, mounting the electronic components to about half-portion of the printed circuit board P2 reached in good condition to the first and second conveyors C1 and C2; and h. a step S8 for transferring the printed circuit board P1 to the fourth conveyor C4 of a discharge buffer side by moving the third conveyor C3 to the original position, simultaneously transferring the printed circuit board P2 reached in good condition on the first and second conveyors C1 and C2 to the third conveyor C3, and transferring a new printed circuit board P3 to the first and second conveyors C1 and C2.

By performing the above steps repeatedly, electronic components are mounted to plural printed circuit boards successively.

Figure 8:
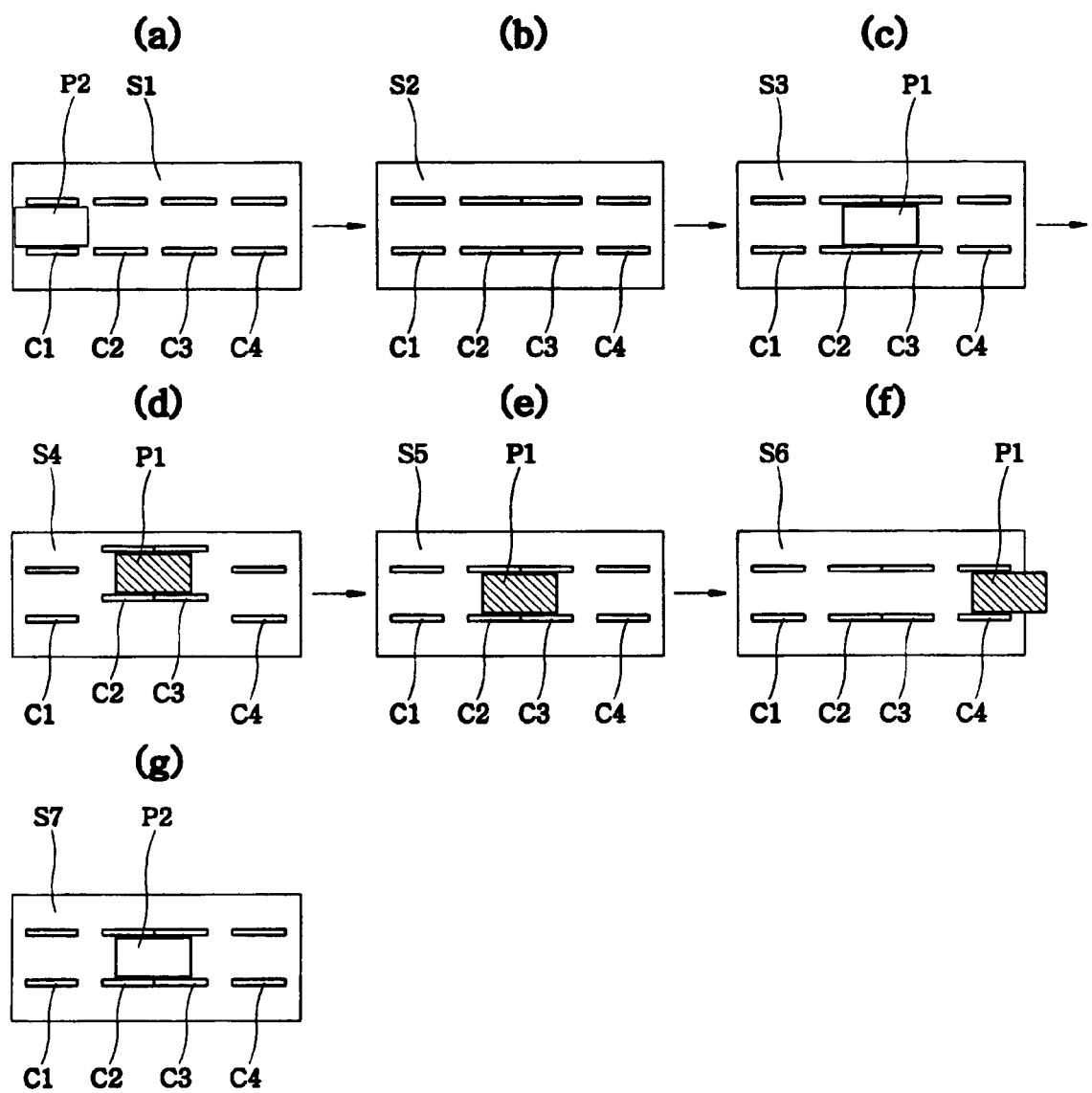

FIGS. 8a to 8g are views illustrating mounting steps of electronic components according to a seventh embodiment of the present invention. As shown in FIGS. 8a to 8g, a mounting method of electronic components according to the seventh embodiment of the present invention comprises:

a. a step S1 for supplying the printed circuit board P1 to the first conveyor C1;

b. a step S2 for combining the first and second conveyors C2 and C3 by connecting the first and second conveyors C2 and C3 when the length of the printed circuit board P1 is longer than those of the respective second and third conveyors C2 and C3;

c. a step S3 for transferring the printed circuit board P1 in order that the printed circuit board P1 transferred to the first conveyor C1 is reached in good condition to the integrated first and second conveyors C2 and C3;

d. a step S4 for moving the first and second conveyors C2 and C3 toward a mounting head and then mounting the electronic components to the printed circuit board P1 reached in good condition to the second and third conveyors C2 and C3;

e. a step S5 for transferring the second and third conveyors C2 and C3 to the original position;

f. a step S6 for transferring the printed circuit board P1 mounted the electronic components in the second and third conveyors C2 and C3 to the fourth conveyor C4, as a discharge conveyor; and g. a step S7 for transferring the printed circuit board P2 of a waiting state to the second and third conveyors C2 and C3 simultaneously when discharging the printed circuit board P1 of the fourth.

In the mounting method according to the fourth embodiment of the present invention, electronic components are mounted safely by connecting the first and second conveyors C2 and C3 when the length of the printed circuit board P1 is longer than those of the respective conveyors C1, C2 and C3.

Figure 9:
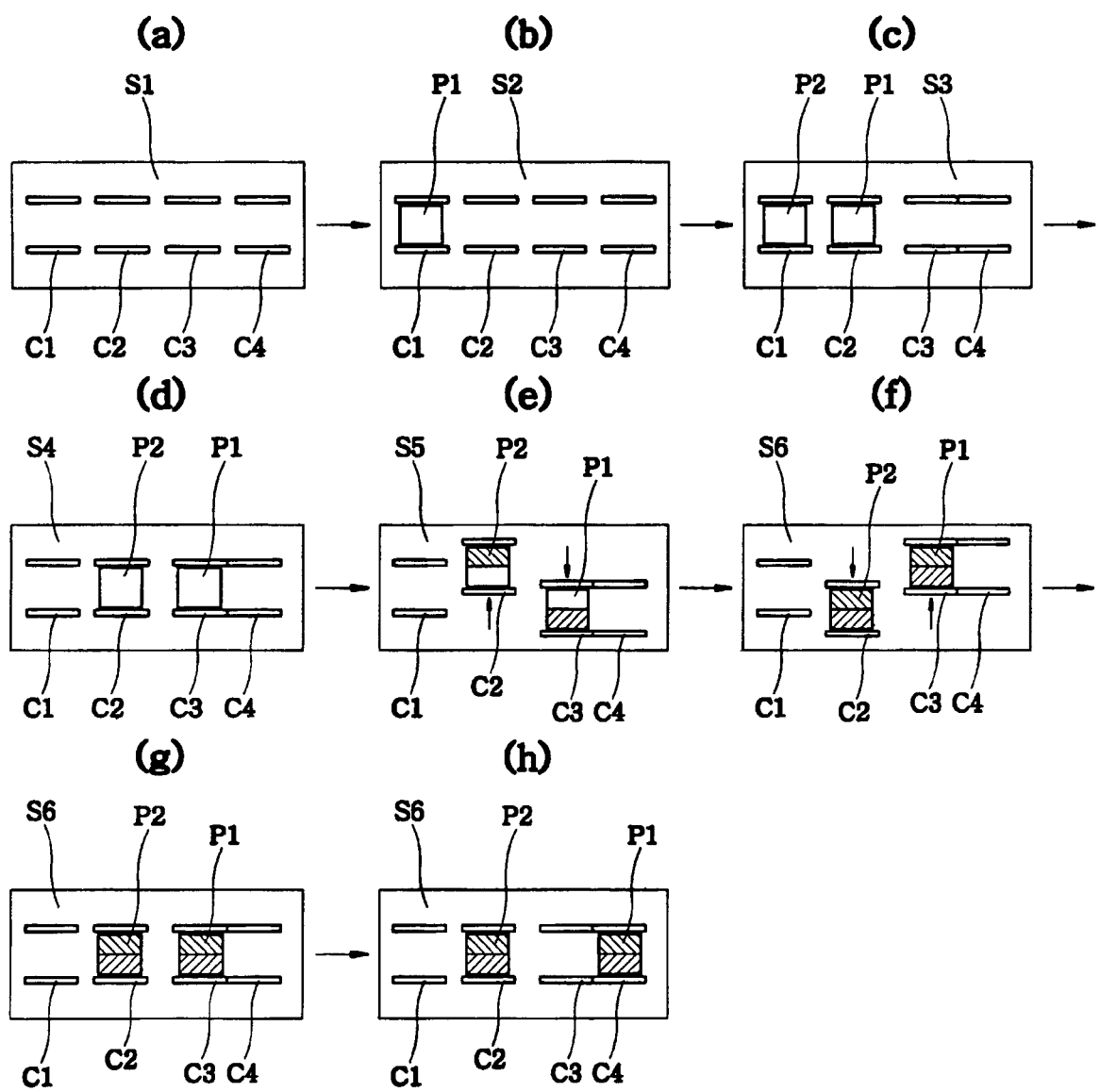

FIGS. 9a to 9h are views illustrating mounting steps of electronic components according to an eighth embodiment of the present invention. As shown in FIGS. 9a to 9h, a mounting method of electronic components according to the eighth embodiment of the present invention comprises:

a. a step S1 for controlling widths of the first to fourth conveyors C1–C4 matching to the width of the printed circuit board P1;

b. a step S2 for waiting the printed circuit board P1 to the first conveyor C1;

c. a step S3 for combining the third and fourth conveyors C3 and C4 by connecting the third and fourth conveyors C3 and C4, transferring the printed circuit board P1 to the second conveyor C2, and transferring a new printed circuit board P2 to the first conveyor C1;

d. a step S4 for transferring the printed circuit board P1 to the third conveyor C3 and transferring the printed circuit board P2 to the second conveyor C2;

e. a step S5 for mounting electronic components to about half-portion of the printed circuit boards P1 and P2 by moving the printed circuit boards P1 and P2 oppositely, respectively;

f. a step S6 for mounting electronic components to the remnant portions of the printed circuit boards P1 and P2 by moving the printed circuit boards P1 and P2 oppositely, respectively;

g. a step S7 for moving the second, third and fourth conveyors C2, C3 and C4 to the central position; and h. a step S8 for moving the printed circuit board P1 to the fourth conveyor C4 and then discharging the board P1.

As discussed earlier, according to the mounting method of electronic components of the present invention, there are several advantages that since the electronic components can be mounted simultaneously to the printed circuit board, the working time is reduced and so the productivity can be enhanced.

Also, since electronic components can be mounted without changing the conveyor irrespective of the printed circuit board having various sizes, the mounting method is very economical.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A mounting method of electronic components, comprising:

controlling widths of a plurality of conveyors, including a first conveyor, a second conveyor, a third conveyor, and a fourth conveyor;

supplying a first printed circuit board to the first conveyor;

transferring the first printed circuit board to the second conveyor, and simultaneously supplying a second printed circuit board to the first conveyor;

transferring the first printed circuit board to the third conveyor, and simultaneously transferring the second printed circuit board from the first conveyor to the second conveyor;

moving the first printed circuit board to one side of the plurality of conveyors and mounting the electronic components to about a half-portion of the first printed circuit board, and simultaneously keeping the second printed circuit board in line with the plurality of conveyors and mounting the electronic components to about a half-portion of the second printed circuit board;

moving the first printed circuit board in line with the plurality of conveyors and mounting the electronic components to a remaining portion of the first printed circuit board, and simultaneously moving the second printed circuit board to the one side of the plurality of conveyors and mounting the electronic components to a remaining portion of the second printed circuit board; and transferring the first printed circuit board from the third conveyor to a fourth conveyor, and simultaneously transferring the second printed circuit board from the second conveyor to the third conveyor, and then discharging the first and second printed circuit boards sequentially.

2. The mounting method of electronic components according to claim 1, wherein mounting the electronic components to the first and second printed circuit boards on the third and second conveyors, respectively, further comprises waiting for a third printed circuit board to be supplied newly to the first conveyor of a buffer side until the mounting work is completed.

3. A mounting method of electronic components, comprising:

supplying a first printed circuit board to one of a plurality of conveyors;

supplying a second printed circuit board to another of the plurality of conveyors located before the one of the plurality of conveyors;

moving the first printed circuit board to one side of the plurality of conveyors and mounting electronic components to about a half-portion of the first printed circuit board, and simultaneously keeping the second printed circuit board in line with the plurality of conveyors and mounting electronic components to about a half-portion of the second printed circuit board; and moving the first printed circuit board in line with the plurality of conveyors and mounting electronic components to a remaining portion of the first printed circuit board, and simultaneously moving the second printed circuit board to one side of the plurality of conveyors and mounting the electronic components to a remaining portion of the second printed circuit board.

* * * * *